(12) United States Patent
Mukai et al.

(10) Patent No.: US 6,676,459 B2
(45) Date of Patent: Jan. 13, 2004

(54) CONDUCTOR CONNECTION METHOD, CONDUCTOR CONNECTION STRUCTURE, AND SOLAR CELL MODULE HAVING CONNECTION STRUCTURE

(75) Inventors: Takaaki Mukai, Nara (JP); Akiharu Takabayashi, Nara (JP); Hidehisa Makita, Kyoto (JP); Masaaki Matsushita, Nara (JP); Shigenori Itoyama, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/152,831

(22) Filed: May 23, 2002

(65) Prior Publication Data

US 2002/0197917 A1 Dec. 26, 2002

(30) Foreign Application Priority Data

May 31, 2001 (JP) ........................................ 2001-164357

(51) Int. Cl.[7] .................................................. H01R 9/24
(52) U.S. Cl. ..................................................... 439/884
(58) Field of Search ............................... 439/854, 874, 439/875, 877, 878, 879, 880

(56) References Cited

U.S. PATENT DOCUMENTS

| 3,744,006 A | * | 7/1973 | O'Loughlin | 439/393 |
| 4,238,640 A | * | 12/1980 | Tweed et al. | 174/87 |
| 4,530,563 A | * | 7/1985 | Brzezinski | 439/874 |
| 5,239,749 A | * | 8/1993 | Fujimaki et al. | 29/877 |
| 5,315,065 A | * | 5/1994 | O'Donovan | 174/84 C |
| 5,370,560 A | * | 12/1994 | Ito | 439/877 |
| 6,093,884 A | * | 7/2000 | Toyomura et al. | 136/244 |
| 6,156,967 A | * | 12/2000 | Ralph et al. | 136/244 |

FOREIGN PATENT DOCUMENTS

| JP | 6-82760 | 11/1994 |
| JP | 3067976 | 4/2000 |

* cited by examiner

*Primary Examiner*—Tulsidas Patel
(74) *Attorney, Agent, or Firm*—Fitzpatrick, Cella, Harper & Scinto

(57) ABSTRACT

A portion of one conductor is bent to form a facing portion where two regions face each other, the facing portion and another conductor are inserted into a ring-shaped caulking member, and crimping is effected. This obviates the need for cutting a conductor in the work of coupling the conductor with a plurality of branch lines and the need for preliminarily threading the conductor through ring-shaped caulking members. Thus, it is feasible to improve reliability of electrical connection and to add a new branch line readily.

27 Claims, 7 Drawing Sheets

FIG. 5A
FIG. 5B
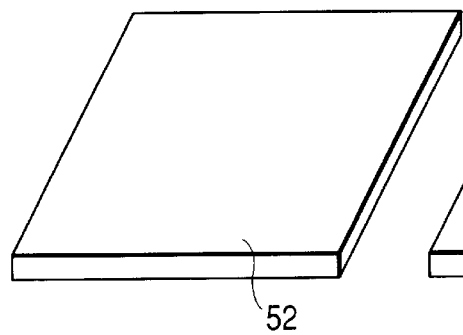
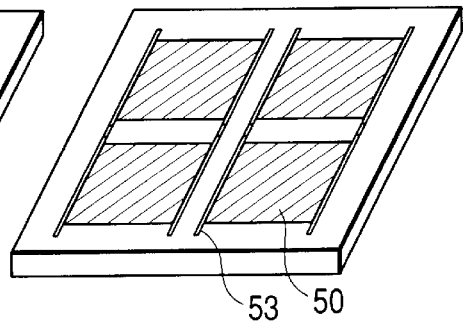
FIG. 5H
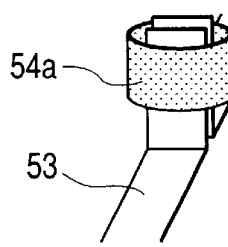
FIG. 5C
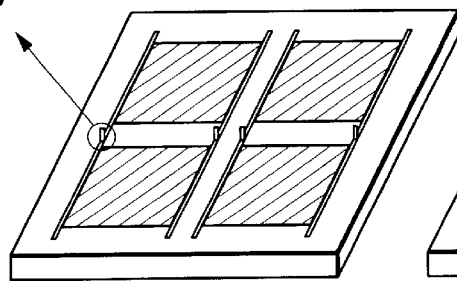
FIG. 5D
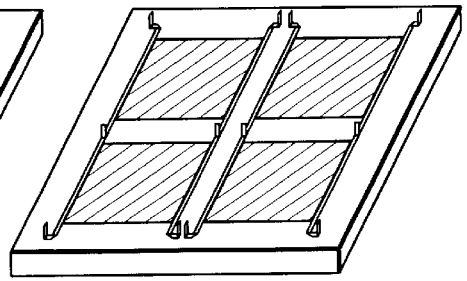
FIG. 5E
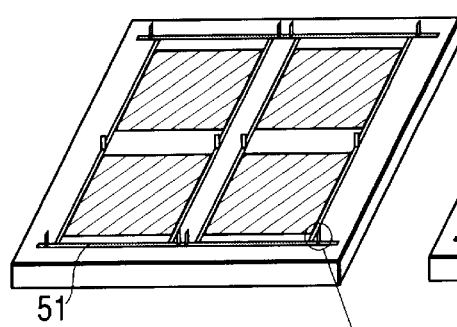
FIG. 5F
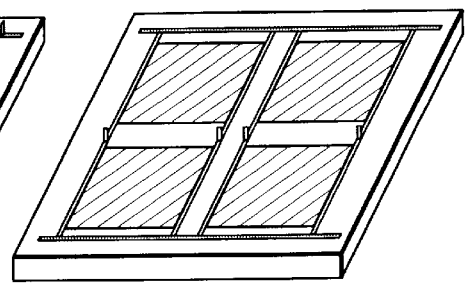
FIG. 5G
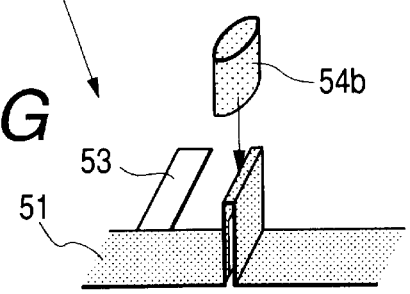

CONDUCTOR CONNECTION METHOD, CONDUCTOR CONNECTION STRUCTURE, AND SOLAR CELL MODULE HAVING CONNECTION STRUCTURE

BACKGROUND OF THE INVENTION

1. Field of the Invention

The present invention relates to a conductor connection method using a ring-shaped caulking member, a conductor connection structure, and a solar cell module to which the conductor connection structure is applied.

2. Related Background Art

A number of methods are known as methods for coupling a conductor with a plurality of other conductors. An example thereof is soldering. Conductors can be readily coupled to each other by soldering. In the case of electrical connection made by soldering, however, amounts of solder applied vary depending upon workers and this results in variations in contact resistance between conductors, which can lead to degradation of reliability. When the soldering work is done outdoors in the cold winter season, a considerable time is necessary for the conductors to reach the melting temperature of the solder.

Another example of connection is a method of coupling a conductor with a plurality of other conductors by welding, but the apparatus for welding is large in size and hard to move and carry. Therefore, this method is not suitable for outdoor works.

For this reason, an electrical connection member called a ring sleeve is frequently used for outdoor, electrical connection works. The ring sleeve is a ring-shaped caulking member, through which a plurality of conductors are passed and crimping (or crimped connection) is effected to establish electrical conduction between the conductors.

The following methods are applied to the coupling between one conductor and a plurality of other conductors with the use of the ring sleeve.

(Method 1)

As shown in FIG. 1, a conductor 10 is cut at positions where conductors 11 are to be coupled thereto and each pair of two cut ends of the conductor 10 are electrically connected to a conductor 11 with a ring sleeve 12.

(Method 2)

As shown in FIG. 2, a conductor 20 is preliminarily threaded through ring sleeves 22 in the same number as the number of conductors 21 to be coupled. The ring sleeves are moved to the positions where the conductors 21 are to be coupled, and thereafter the conductors 21 are passed through the corresponding ring sleeves 22 and crimping is carried out to establish electrical connection.

However, since the method 1 necessitates the cutting work of the conductor 10 at the positions where the conductors 11 are to be coupled thereto, the number of cut portions of the conductor 10 increases depending upon the number of conductors 11 to be coupled. Since the increase in the cut portions of the conductor also increases the total contact resistance between the conductors, power loss becomes significant. In addition, the conductor cut at a plurality of positions and connected by the ring sleeves is inferior in reliability to a single conductor. Further, the method 1 requires the work of cutting the conductor 10 at the coupling positions of the conductors 11, and is thus disadvantageous in that the cutting work takes some time and the number of parts increases.

On the other hand, the method 2 requires the preparatory work of threading the conductor 20 through the ring sleeves in the same number as the number of conductors 21 to be coupled, and thus does not allow a new conductor to be coupled between conductors having already been coupled. Since the ring sleeves correspond to the respective conductors 21, there is a high possibility that a conductor 21 is incorrectly coupled using another ring sleeve than its corresponding ring sleeve during the work. Further, where there is no space between a conductor and a mount body to which the conductor is fixed, the crimping work of the ring sleeve must be carried out by forcing a crimping tool into between the conductor and the mount body, so that undue stress may be exerted on the conductor.

SUMMARY OF THE INVENTION

The present invention has been accomplished in order to solve the above problems and an object of the invention is to provide a conductor connection method and a conductor connection structure permitting one conductor to be readily coupled to one or more other conductors with the use of a ring sleeve (ring-shaped caulking member), and a solar cell module to which the conductor connection structure is applied.

For achieving the object, a preferred embodiment of the present invention is a method of connecting conductors, comprising the steps of bending a portion of a first conductor to form a facing portion where two regions face each other, inserting the facing portion and a second conductor into a ring-shaped caulking member, and effecting crimping.

Another preferred embodiment of the present invention is a method of connecting conductors, which comprises, in sequence, the steps of bending a first conductor to form a facing portion where two regions face each other; inserting the facing portion into a ring-shaped caulking member; bending a head of the facing portion; inserting a second conductor into the ring-shaped caulking member; crimping the ring-shaped caulking member; and turning a crimped portion down onto an installation surface.

Another preferred embodiment of the present invention is a conductor connection structure comprising a first conductor having a bent portion where two regions face each other to form a facing portion; a second conductor; and a ring-shaped caulking member crimping the facing portion of the first conductor and the second conductor.

Another preferred embodiment of the present invention is a solar cell module comprising a plurality of photovoltaic elements, and an electrical connection member for electrically connecting the plurality of photovoltaic elements, wherein a facing portion having two regions faced each other formed by bending a portion of the electrical connection member, and an electrode member of the photovoltaic element are crimped with a ring-shaped caulking member.

The conductor connection methods, the conductor connection structure, and the solar cell module as described above obviate the need for cutting the first conductor at the position where the second conductor is to be coupled, which can prevent the degradation of reliability of the connection part. They can obviate the need for the cutting work of the first conductor or the work of preliminarily threading the first conductor through the ring-shaped caulking members in the same number as the second conductors to be coupled thereto, which enhances workability. Since there is no need for the work of preliminarily threading the first conductor through the ring-shaped caulking members, another conductor may also be added afterward in such a manner that the additional conductor is connected to the first conductor with a ring-shaped caulking member.

Other features and other advantageous effects of the present invention will be detailed hereinafter with reference to the drawings.

BRIEF DESCRIPTION THE DRAWINGS

FIGS. 5A, 5B, 5C, 5D, 5E, 5F, 5G and 5H are perspective views for explaining the production (construction) procedure of the solar cell module in Example 2 of the present invention;

DETAILED DESCRIPTION OF THE PREFERRED EMBODIMENTS

Figure 1:
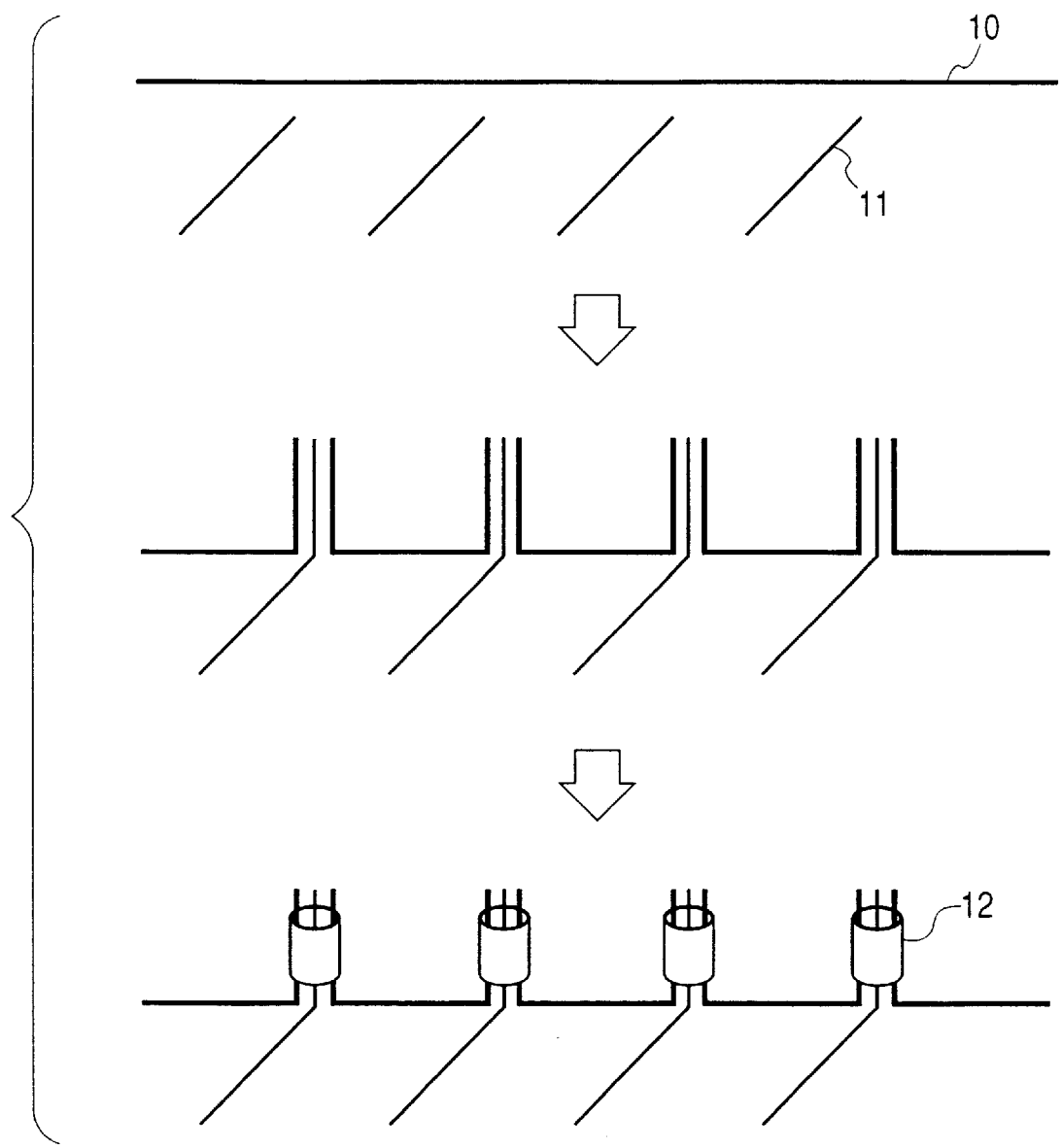
FIG. 1 is a view showing an example of a common conductor connection method.
Figure 2:
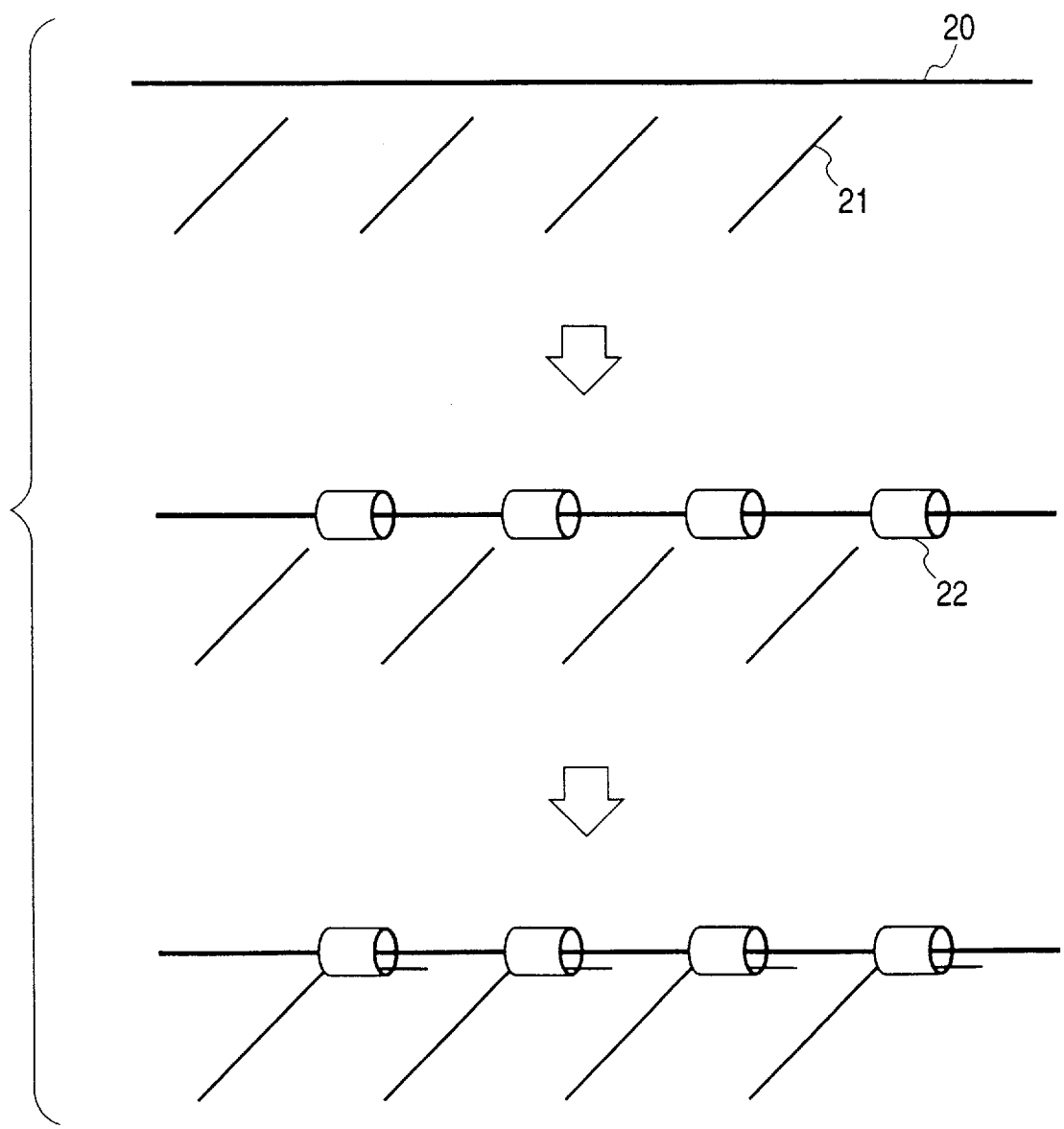
FIG. 2 is a view showing another example of a common conductor connection method.

The conductor connection method, conductor connection structure, and solar cell module of the present invention will be further described below.

Namely, a conductor connection method of the present invention comprises the steps of bending a portion of a first conductor to form a facing portion where two regions face each other; inserting both of the two regions of the facing portion, and a second conductor into a ring-shaped caulking member; and effecting crimping.

Since the foregoing conductor connection method of the present invention obviates the need for the work of cutting one conductor at the positions where other conductors are to be coupled, it can prevent the degradation of reliability of the connection part and omit the work of cutting one conductor or the work of preliminarily threading one conductor through the ring-shaped caulking members in the same number as the number of other conductors to be coupled to the one conductor, thus enhancing workability. Since one conductor does not have to be preliminarily threaded through the ring-shaped caulking members, the conductor connection method of the present invention is flexibly adapted to the need for addition of another conductor afterward.

In the foregoing conductor connection method of the present invention, preferably, crimping is effected in a state in which the second conductor is interposed between the two regions of the facing portion formed in the first conductor, or in a state in which the second conductor covers at least a part of the two regions of the facing portion formed in the first conductor. These configurations can increase the contact area between the conductors and thus decrease the contact resistance.

Preferably, at least one of the facing portion with the two regions formed in the first conductor and the second conductor is inserted into the ring-shaped caulking member and thereafter at least one of the facing portion with the two regions and the second conductor is bent at a head of an inserted portion thereof. This configuration can prevent the ring-shaped caulking member from slipping off from the conductor(s) before the crimping work, for example, during transportation and facilitate the connection work at the work site to enhance work efficiency.

Preferably, after the crimping work, the crimped region is turned down onto an installation surface. This configuration can prevent an accident of disconnection caused by a person snagging on the crimped region.

Preferably, the first conductor is provided with a flexure at least in part in a state before the step of forming the facing portion. With this configuration, even when there arises a need for addition of a new conductor to be connected to the first conductor, two facing regions can be formed without exerting undue tension on the first conductor.

Another conductor connection method of the present invention is a method of connecting conductors, which comprises, in sequence, the steps of bending a first conductor to form a facing portion where two regions face each other; inserting the facing portion into a ring-shaped caulking member; bending a head of the facing portion; inserting a second conductor into the ring-shaped caulking member; crimping the ring-shaped caulking member; and turning a crimped portion down onto an installation surface. This configuration also provides the action and effect similar to those provided by the aforementioned connection method.

In these conductor connection methods of the present invention, preferably, the shape of a section parallel to an opening surface of the ring-shaped caulking member is elliptic and the ring-shaped caulking member after the crimping has at least two depressions. Normally, the ring-shaped caulking member has a single depression. In contrast, because even with increase in the contact resistance between conductors in one part, the electric current can flow through another contact part, the above configuration can prevent increase of power loss and further enhance the reliability of the electrical connection part.

In these conductor connection methods of the present invention, preferably, at least one of the first and the second conductors is a foil member; the foil member is selected from copper foil, silvered copper foil, and tinned copper foil; and the copper foil comprises oxygen-free copper, tough pitch copper, or phosphorus deoxidized copper and has a thickness of not less than 0.1 mm nor more than 3 mm.

A conductor connection structure of the present invention comprises a first conductor having a bent portion where two regions face each other to form a facing portion; a second conductor; and a ring-shaped caulking member crimping the facing portion of the first conductor and the second conductor.

The foregoing conductor connection structure of the present invention comprises the following as further preferred features:

the second conductor is interposed between the two regions of the facing portion formed in the first conductor;

the second conductor covers at least a part of the facing portion formed in the first conductor;

a portion crimped with the ring-shaped caulking member is turned down onto an installation surface;

the shape of a section parallel to an opening surface of the ring-shaped caulking member before the crimping is elliptic and the ring-shaped caulking member after the crimping has at least two depressions;

at least one of the first and the second conductors is a foil member;

the foil member is selected from the group consisting of copper foil, silvered copper foil, and tinned copper foil; and at least one of the first and the second conductors is copper foil and the copper foil comprises oxygen-free copper, tough pitch copper or phosphorus deoxidized copper and has a thickness of not less than 0.1 mm nor more than 3 mm.

The foregoing conductor connection structure of the present invention also provided action and effect similar to those provided by the aforementioned conductor connection methods of the present invention.

A solar cell module of the present invention is a solar cell module comprising a plurality of photovoltaic elements, and an electrical connection member for electrically connecting the plurality of photovoltaic elements, wherein a facing portion having two regions faced each other formed by bending a portion of the electrical connection member, and an electrode member of the photovoltaic element are crimped with a ring-shaped caulking member.

Preferred embodiments of the conductor connection method, the conductor connection structure, and the solar cell module according to the present invention will be described below in detail as an example of application of these to a solar cell module, but it is noted that the present invention is by no means intended to be limited to the embodiments.

Figure 4A:
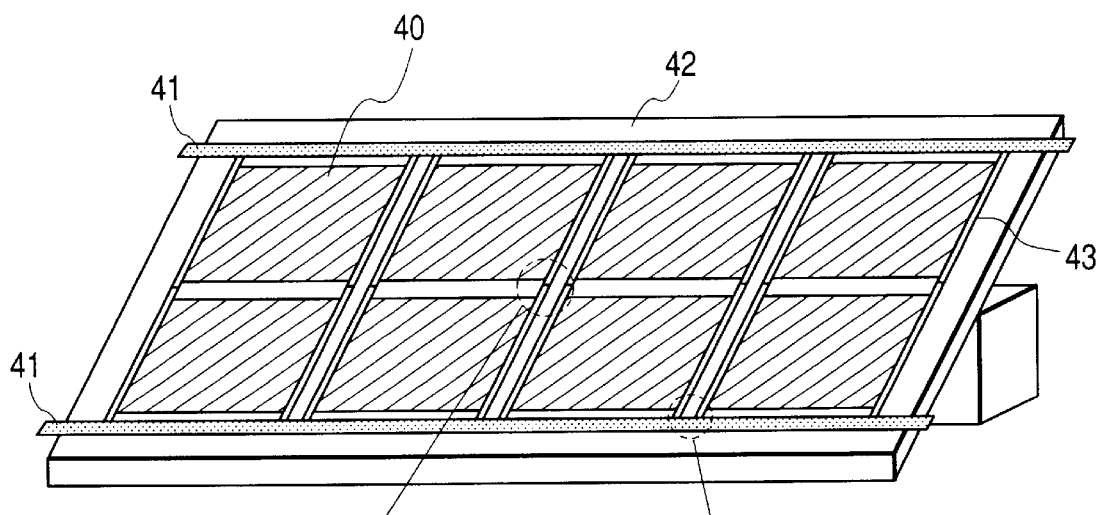
FIGS. 4A, 4B and 4C are perspective views schematically showing the solar cell module in Example 1 of the present invention.
Figure 4B:
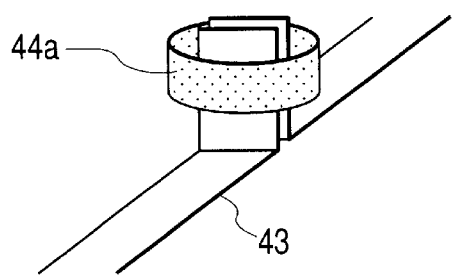
Figure 4C:
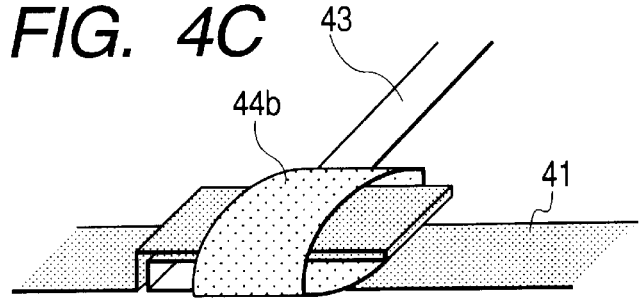

FIGS. 4A to 4C are schematic representations showing an example of the solar cell module according to the present invention. The solar cell module of the present embodiment is mainly comprised of a plurality of (eight in the present example) photovoltaic elements 40, electrical wiring members 41, and a back member 42.

The photovoltaic elements 40 have tab-shaped electrodes 43 and are adhered and fixed to the back member 42 with an adhesive or a double-coated tape (or two sided adhesive tape). The photovoltaic elements 40 are connected two each in series in such a manner that two photovoltaic elements are electrically connected to each other by inserting the tab-shaped electrodes 43 of the two photovoltaic elements into a ring-shaped caulking member 44a and crimping the caulking member onto the electrodes.

The series photovoltaic elements are connected in parallel (four parallel rows in the present example) by the electrical connection members 41, and the connection method and connection structure of the present invention are applied to the connection portions.

Figure 3A:
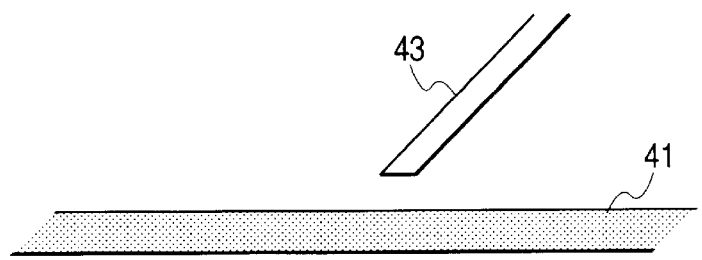
FIGS. 3A, 3B, 3C, 3D and 3E are perspective views for explaining the operation procedure of the conductor connection method in Example 1 of the present invention.
Figure 3B:
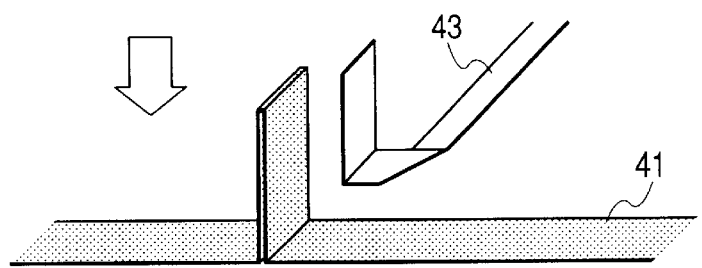
Figure 3C:
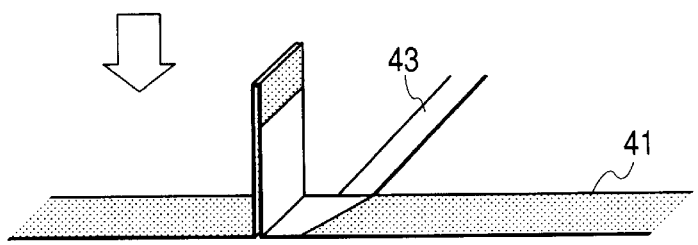
Figure 3D:
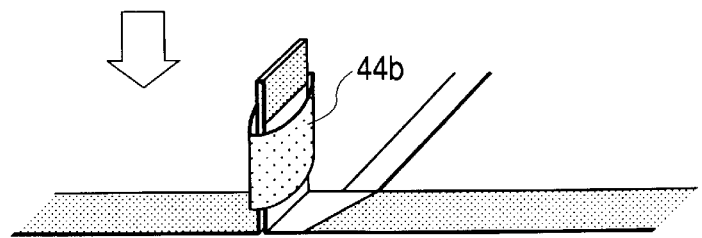
Figure 3E:
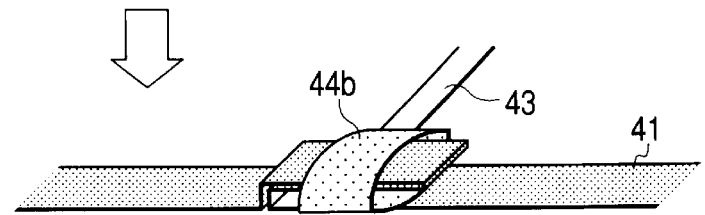

Specifically, the connection work is carried out as shown in FIGS. 3A to 3E. First, an electrical wiring member 41 (corresponding to a first conductor) is bent at a portion where an electrode 43 of a photovoltaic element (corresponding to a second conductor) is to be connected, to form a facing portion where two regions face each other, and the electrode 43 is also bent at an end thereof so as to be readily superimposed on the facing portion where the two regions of the electrical wiring member 41 face each other (FIG. 3B). Then, the end of the electrode 43 is laid over the facing portion where the two regions formed in the electrical wiring member 41 face each other (FIG. 3C). Next, the facing portion where the two regions formed in the electrical wiring member 41 face each other, and the end of the electrode 43 are inserted into a ring-shaped caulking member 44b (FIG. 3D). As a final step, the ring-shaped caulking member 44b is crimped with a crimping tool and the crimped region is turned down onto an installation surface (FIG. 3E).

As described above, by the application of the present invention, the electrode 43 can be readily added anywhere in the electrical wiring member 41 without cutting the electrical wiring member 41, which can enhance the reliability of the electrical connection part and the workability of the connecting work.

The following will describe the components of the solar cell module of the present invention.

(Photovoltaic Elements 40)

There are no specific restrictions on the photovoltaic elements. In general, a photovoltaic element has at least a transparent electrode layer, a photoelectric conversion layer, and a back electrode layer. Examples of the photovoltaic elements include monocrystalline silicon photovoltaic elements, polycrystalline silicon photovoltaic elements, amorphous silicon photovoltaic elements, copper indium selenide photovoltaic elements, compound semiconductor photovoltaic elements, and so on.

The transparent electrode layer is a current-collecting electrode on the light incidence side, which transmits light and also functions as an antireflection film in an optimized thickness. A material suitably applicable to the transparent electrode layer is one selected from electrically conductive oxides such as $In_2O_3$, $SnO_2$, ITO ($In_2O_3+SnO_2$), ZnO, CdO, $Cd_2SnO_4$, $TiO_2$, $Ta_2O_5$, $Bi_2O_3$, $MoO_3$, $Na_xWO_3$, and the like, or their mixtures.

The back electrode layer functions as a collecting electrode for collecting charge generated on the non-light-receiving side of the photoelectric conversion layer. Specific materials for the back electrode layer include metals such as Al, Ag, Au, Cu, Ti, Ta, W, and so on, but the back electrode layer is not limited to these materials. Methods suitably applicable to formation of the back electrode layer include chemical vapor deposition, sputtering, and so on. A preferred example of the back electrode layer is an electroconductive substrate functioning as a support substrate for supporting each layer so as to prevent it from being broken by force exerted from the outside. Specific materials for the electroconductive substrate include thin films of metals such as Fe, Ni, Cr, Al, Mo, Au, Nb, Ta, V, Ti, Pt, Pb, and so on or their alloys, and complexes thereof.

The photovoltaic elements with flexibility are more preferably applicable, because they are resistant to breakage with some flexure during execution of works.

(Electrical Wiring Members 41)

The electrical wiring members are used in the work of electrically connecting the series photovoltaic elements in parallel. Foil members are suitably used as the electrical wiring members, and specific materials for them include copper foil, tinned copper foil, silvered copper foil, and so on. The copper foil is preferably one made of oxygen-free copper, tough pitch copper, or phosphorus deoxidized copper and having the thickness of not less than 0.1 mm nor more than 3 mm (copper strip). It is also possible to use an electric wire or a cable wire the surface of which is coated with polyethylene terephthalate, polyvinyl chloride, polyvinylidene chloride, or the like.

(Back Member 42)

The back member functions as a reinforcing plate for providing the photovoltaic elements with enough mechanical strength. A material for the back member can be selected from a concrete block, galvanized sheet iron, a steel sheet applied with a weather-resistant material such as fluororesin, polyvinyl chloride, or the like, a stainless steel plate, and so on, but the materials for the back member are not limited to these examples.

(Electrodes 43)

The electrodes 43 function as collecting electrodes for extracting the charge generated on the light receiving side and on the non-receiving side of the photoelectric conversion element in the photovoltaic elements. The electrodes 43 are electrically connected to the light receiving surface of the transparent electrode layer and to the non-receiving surface of the back electrode layer in the photovoltaic elements. Methods of the connection include a silver paste, an electroconductive tape, a double-coated tape, spot welding, soldering, and so on.

Foil members are suitably applicable to the electrodes 43, and specific materials include copper foil, tinned copper foil, silvered copper foil, and so on. The copper foil is preferably one made of oxygen-free copper, tough pitch copper, or phosphorus deoxidized copper and having a thickness of not less than 0.1 mm nor more than 3 mm.

(Ring-Shaped Caulking Members 44a, 44b)

The ring-shaped caulking members function to electrically connect the conductors to each other. Specifically, they can be selected from butt ring sleeves, superposition ring sleeves, etc. of oxygen-free copper or tough pitch copper or the like. The caulking members are more preferably ring sleeves insulatively coated with rigid poly(vinyl chloride) or the like, in order to enhance the durability at the ring sleeves and at the electrical connection portions.

(Adhesive)

The adhesive is used in the work of adhering the photovoltaic elements 40 to the back member 42 and required qualities thereof are weather resistance, water resistance, alkali resistance, light resistance, elasticity, electrical insulation, and so on. Specific materials for the adhesive include epoxy adhesives, silicone adhesives, and so on.

(Double-Coated Tape)

The double-coated tape is used in the work of adhering the photovoltaic elements 40 to the back member 42, and required qualities thereof are weather resistance, water resistance, alkali resistance, light resistance, elasticity, electrical insulation, and so on. Specific materials for the double-coated tape include acrylic double-coated tapes, butyl double-coated tapes, and so on.

Examples of the present invention will be described below, but it is noted that the present invention is by no means intended to be limited to the examples.

EXAMPLE 1

The present example is an example in which the conductor connection method and connection structure of the present invention are applied to the electrical connection portions of the solar cell module as shown in FIGS. 4A to 4C.

In the solar cell module of the present example, amorphous silicon photovoltaic elements were used as the photovoltaic elements 40, copper strips as the electrical wiring members 41, and a concrete block as the back member 42.

The photovoltaic elements 40 have the electrodes 43 of silvered copper foil 6 mm wide and 100 $\mu$m thick, and are adhered and fixed to the concrete block 42 with an epoxy elastic adhesive.

The photovoltaic elements 40 are connected two each in series, and the elliptic ring sleeves 44a are used at the electrical connection portions between the photovoltaic elements.

The series photovoltaic elements are connected in parallel by the copper strips 41 of oxygen-free copper 10 mm wide and 300 $\mu$m thick. The copper strips 41 are bent so as to form the facing portion where two regions face each other, at the connection portions of the series photovoltaic elements. The electrodes 43 of the series photovoltaic elements are also bent so as to correspond to the facing portion where the two regions of the copper strips 41 face each other, and crimping is effected with the elliptic ring-shaped caulking members 44b in a state in which the end of each electrode 43 is superimposed on the facing portion where the two regions formed in the copper strip 41 face each other. The procedure of this connecting work will be described below with reference to FIGS. 3A to 3E.

First, the copper strip 41 is bent at a connecting portion to the electrode 43 to form the facing portion where two regions face each other. At the same time, the electrode 43 is also bent at its end so as to be readily superimposed on the facing portion where the two regions face each other (cf. FIG. 3B).

Then, the end of electrode 43 is superimposed on the facing portion where the two regions formed in the copper strip 41 face each other (FIG. 3C).

Next, the facing portion where the two regions formed in the copper strip 41 face each other, and the end of electrode 43 are inserted into the ring-shaped caulking member 44b (FIG. 3D).

Finally, the ring-shaped caulking member 44b is crimped by use of a crimping tool and the crimped region is turned down onto the installation side (FIG. 3E).

In the present example, the electrical connection with high reliability was able to be readily established without the need for the work of cutting the copper strips 41 at the connecting portions to the electrodes 43.

EXAMPLE 2

The present example is an example of production of the solar cell module wherein in the work of connecting the series photovoltaic elements in parallel with a copper strip of oxygen-free copper, the end of the electrode of silvered copper foil of each photovoltaic element is interposed between the two regions of the facing portion where the two regions face each other, formed by bending the copper strip, and crimping is effected with the elliptic ring-shaped caulking member in the thus interposed state. The present example is substantially the same as Example 1 except for the respects specified herein.

The production (construction) procedure of the solar cell module in accordance with the present example will be described with reference to FIGS. 5A to 5H.

First, the concrete block 52 as the back member is placed at a desired place (FIG. 5A).

Then, the photovoltaic elements 50 are bonded to the concrete block 52 (FIG. 5B).

Next, the photovoltaic elements 50 are connected two each in series (FIG. 5C). Specifically, the electrodes 53 of silvered copper foil in two adjacent photovoltaic elements are inserted into an elliptic ring-shaped caulking member 54a and crimping is effected.

Then, the ends of the electrodes 53 of the series photovoltaic elements are bent by about 20 mm in height uprightly (FIG. 5D).

Then, each electrode 53 is interposed between two facing regions formed in a copper strip 51 of oxygen-free copper and they are inserted into an elliptic ring-shaped caulking member 54b (FIGS. 5E and 5G).

Finally, the ring-shaped caulking member 54b is crimped and the crimped portion is turned down onto the concrete block (FIG. 5F).

In the present example, since the end of each electrode 53 is sandwiched between the regions of the copper strip 51, the contact area between the electrode 53 and the copper strip 51 is greater than that in Example 1, so that the contact resistance can be reduced. Further, since the contact area between the electrode 53 and the copper strip 51 is large, the contact resistance will not increase so much even if the contact surfaces thereof corrode in part. Therefore, long-term reliability of the connection part is enhanced.

EXAMPLE 3

The present example is an example of production of the solar cell module wherein in the work of connecting the series photovoltaic elements in parallel with the copper strip of oxygen-free copper, the electrode of silvered copper foil is placed to cover the facing portion where the two regions face each other, formed by bending the copper strip and crimping is effected in the covering (or sandwiching) state with the elliptic ring-shaped caulking member. The present example is substantially the same as Example 1 and Example 2 except for the respects specified herein.

A method of connecting an electrode of a photovoltaic element to a copper strip in the present example will be described with reference to FIGS. 6A to 6E.

Figure 6A:
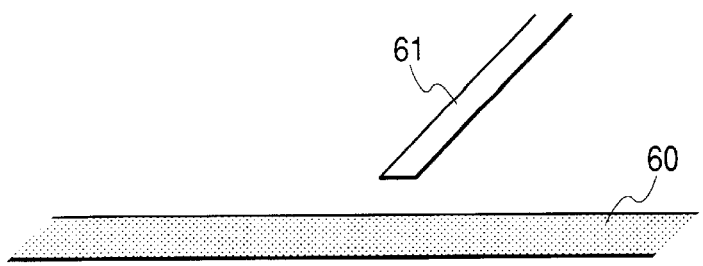
FIGS. 6A, 6B, 6C, 6D and 6E are perspective views for explaining the operation procedure of the conductor connection method in Example 3 of the present invention.
Figure 6B:
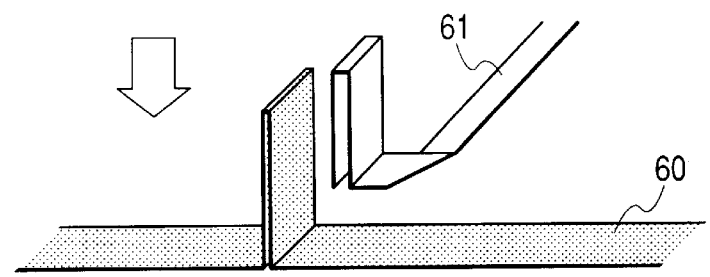

First, a facing portion where two regions face each other is formed in each of the copper strip 60 and an end of the electrode 61 of the photovoltaic element (FIG. 6B).

Figure 6C:
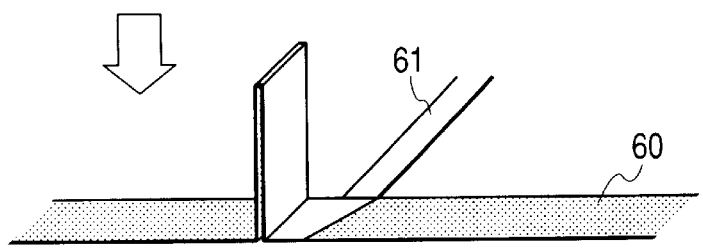

Then, the facing portion where the two regions of the copper strip 60 face each other is interposed between the two facing regions formed at the end of the electrode 61 (FIG. 6C).

Figure 6D:
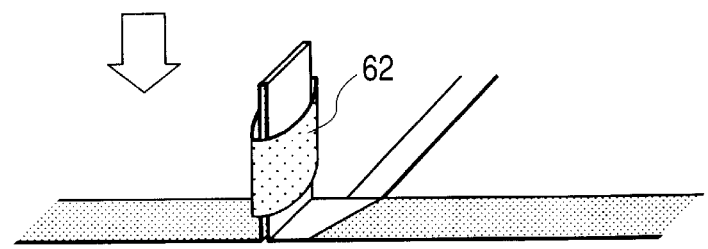

Then, a ring-shaped caulking member 62 is placed around the superimposed region of the copper strip 60 and the electrode 61 (FIG. 6D).

Figure 6E:
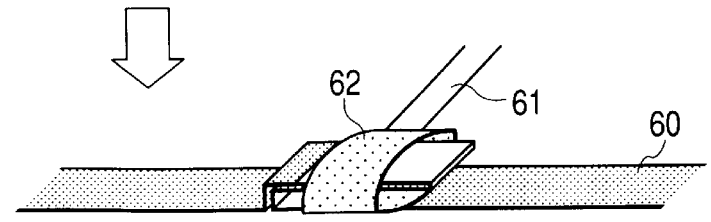

Finally, the ring-shaped caulking member 62 is crimped and the crimped portion is turned down onto the installation side (FIG. 6E).

In the present example, since the facing portion where the two regions of the copper strip 60 face each other is sandwiched between the two regions of the end of the electrode 61, the contact area between the electrode 61 and the copper strip 60 is larger than in Example 1, so that it is also feasible to reduce the contact resistance and enhance the long-term reliability of the connection part, as in Example 2.

EXAMPLE 4

The present example is an example of production of the solar cell module wherein in the work of connecting the series photovoltaic elements in parallel with the copper strip of oxygen-free copper, a ring-shaped caulking member of elliptic sectional shape is used and the ring-shaped caulking member is provided with depressions (crimped portions) at four positions. The present example is substantially the same as in Examples 1 to 3 except for the respects specified herein.

Figure 7A:
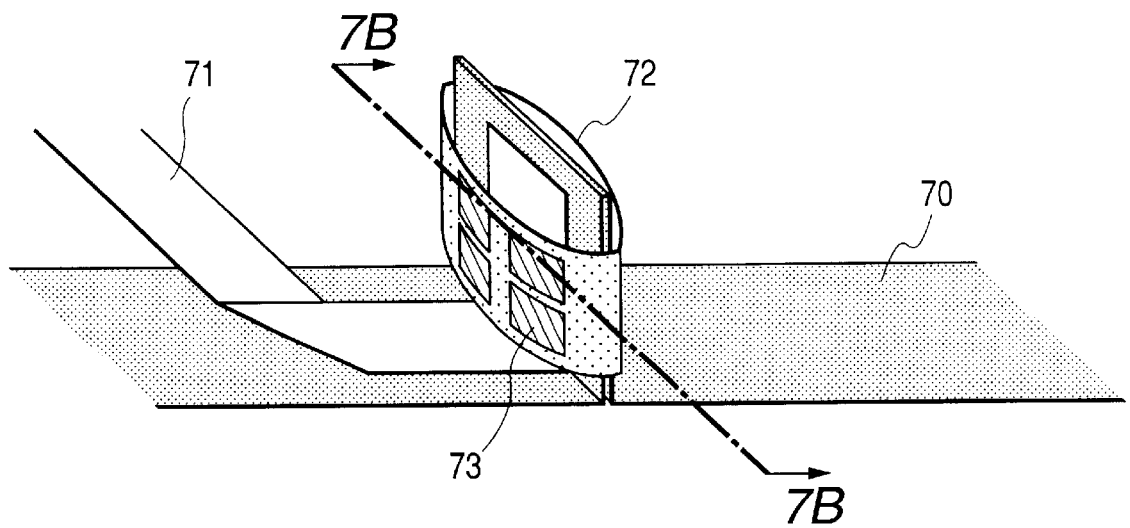
FIGS. 7A, 7B and 7C are views for explaining the conductor connection structure in Example 4 of the present invention.
Figure 7B:
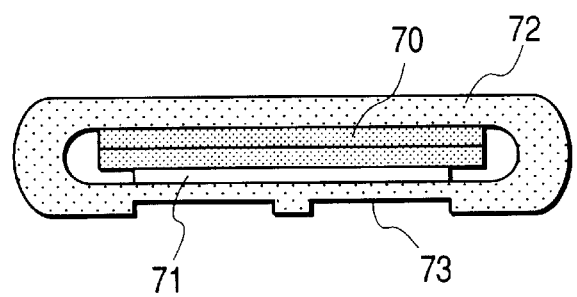
Figure 7C:
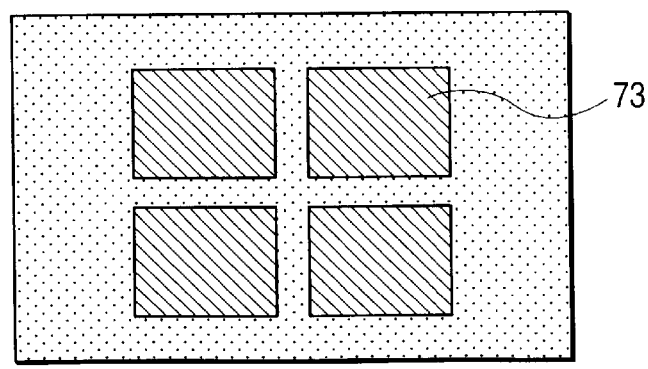

FIGS. 7A to 7C show a connection portion between a copper strip and an electrode of a photovoltaic element in the present example. FIG. 7A is a perspective view of the connection portion, FIG. 7B is a sectional view taken along line 7B—7B of FIG. 7A, and FIG. 7C a front view showing the depressions in-the ring-shaped caulking member.

In the present example, the facing portion where the two regions face each other, formed in the copper strip 70, and the end of the silvered copper foil 71 are inserted into the ring-shaped caulking member 72 of tinned oxygen-free copper and crimped therewith. During the crimping work, the depressions 73 are formed at four positions (or locations) in the ring-shaped caulking member, as illustrated. This establishes contact at least at the four positions between the copper strip 70 and the silvered copper foil 71, and even with increase in the contact resistance in part, the electric current can flow through the other contact portions, which can prevent increase in power loss.

As described above, with the conductor connection method and connection structure of the present invention, a portion of a first conductor is bent to form a facing portion where two regions face each other, the facing portion and a second conductor are inserted into a ring-shaped caulking member, and crimping is effected. This configuration obviates the need for the work of cutting the first conductor at the coupling part to the second conductor, which can prevent the degradation of reliability of the connection part. In addition, the above configuration can omit the cutting work of the first conductor or the work of preliminarily threading the first conductor through ring-shaped caulking members in the same number as the number of other conductors to be connected to the first conductor, whereby the workability can be enhanced. Since the first conductor does not have to be preliminarily threaded through ring-shaped caulking members, the method and structure of the present invention are flexibly adaptable to a need for addition of another conductor afterward.

Further, by applying the conductor connection structure of the present invention to the solar cell module, the solar cell module can be obtained with high workability and with high reliability of the electrical connection part.

What is claimed is:

1. A method of connecting conductors, comprising the steps of:

bending a portion of a first conductor to form a facing portion where two regions face each other, the two regions being connected to each other via a portion of the first conductor, inserting the facing portion and a second conductor into a ring-shaped caulking member, and effecting crimping.

2. The method according to claim 1, wherein the second conductor is interposed between the two regions of the facing portion formed in the first conductor and the crimping is effected in the interposed state.

3. The method according to claim 1, wherein the second conductor covers at least a part of the facing portion formed in the first conductor and the crimping is effected in the covering state.

4. The method according to claim 1, wherein at least one of the second conductor and the facing portion formed in the first conductor is inserted into the ring-shaped caulking member and thereafter at least one of the facing portion and the second conductor is bent at a head of an inserted portion thereof.

5. The method according to claim 1, wherein after the crimping, a crimped portion is turned down onto an installation surface.

6. The method according to claim 1, wherein the first conductor has a flexure at least in a part thereof before the formation of the facing portion.

7. The method according to claim 1, wherein the shape of a section parallel to an opening surface of the ring-shaped caulking member before the crimping is elliptic and the ring-shaped caulking member after the crimping has at least two depressions.

8. The method according to claim 1, wherein at least one of the first and the second conductors is a foil member.

9. The method according to claim 8, wherein the foil member is selected from the group consisting of copper foil, silvered copper foil, and tinned copper foil.

10. The method according to claim 1, wherein at least one of the first and the second conductors is copper foil and the copper foil comprises oxygen-free copper, tough pitch copper or phosphorus deoxidized copper and has a thickness of not less than 0.1 mm nor more than 3 mm.

11. A method of connecting conductors, comprising, in sequence, the steps of:

bending a first conductor to form a facing portion where two regions face each other;

inserting the facing portion into a ring-shaped caulking member;

bending a head of the facing portion;

inserting a second conductor into the ring-shaped caulking member;

crimping the ring-shaped caulking member; and turning a crimped portion down onto an installation surface.

12. The method according to claim 11, wherein the shape of a section parallel to an opening surface of the ring-shaped caulking member before the crimping is elliptic and the ring-shaped caulking member after the crimping has at least two depressions.

13. The method according to claim 11, wherein at least one of the first and the second conductors is a foil member.

14. The method according to claim 13, wherein the foil member is selected from the group consisting of copper foil, silvered copper foil, and tinned copper foil.

15. The method according to claim 11, wherein at least one of the first and the second conductors is copper foil and the copper foil comprises oxygen-free copper, tough pitch copper or phosphorus deoxidized copper and has a thickness of not less than 0.1 mm nor more than 3 mm.

16. A conductor connection structure comprising:

a first conductor having a bent portion where two regions face each other to form a facing portion, the two regions being connected to each other via a portion of the first conductor;

a second conductor; and a ring-shaped caulking member crimping the facing portion of the first conductor and the second conductor.

17. The connection structure according to claim 16, wherein the second conductor is interposed between the two regions of the facing portion formed in the first conductor.

18. The connection structure according to claim 16, wherein the second conductor covers at least a part of the facing portion formed in the first conductor.

19. The connection structure according to claim 16, wherein a portion crimped with the ring-shaped caulking member is turned down onto an installation surface.

20. The connection structure according to claim 16, wherein the shape of a section parallel to an opening surface of the ring-shaped caulking member before the crimping is elliptic and the ring-shaped caulking member after the crimping has at least two depressions.

21. The connection structure according to claim 16, wherein at least one of the first and the second conductors is a foil member.

22. The connection structure according to claim 21, wherein the foil member is selected from the group consisting of copper foil, silvered copper foil, and tinned copper foil.

23. The connection structure according to claim 16, wherein at least one of the first and the second conductors is copper foil and the copper foil comprises oxygen-free copper, tough pitch copper or phosphorus deoxidized copper and has a thickness of not less than 0.1 mm nor more than 3 mm.

24. A solar cell module comprising a plurality of photovoltaic elements, and an electrical connection member for electrically connecting the plurality of photovoltaic elements, wherein a portion of the electrical connection member is bent to form a facing portion having two regions facing each other, the two regions being connected to each other via a portion of the electrical connection member, and wherein the facing portion and an electrode member of the photovoltaic element are crimped with a ring-shaped caulking member.

25. The module according to claim 24, wherein the electrode member of the photovoltaic element is interposed between the two regions of the facing portion of the electrical connection member.

26. The module according to claim 24, wherein the electrode member of the photovoltaic element covers at least a part of the facing portion of the electrical connection member.

27. The module according to claim 24, wherein a portion crimped with the ring-shaped caulking member is turned down onto an installation surface.

* * * * *